(12) United States Patent
Solomon et al.

(10) Patent No.: US 11,815,486 B2
(45) Date of Patent: Nov. 14, 2023

(54) ION SENSITIVE FIELD EFFECT TRANSISTOR (FET) WITH BACK-GATE COUPLED REFERENCE ELECTRODE

(71) Applicant: International Business Machines Corporation, Armonk, NY (US)

(72) Inventors: Paul M. Solomon, Yorktown Heights, NY (US); Sufi Zafar, Briarcliff Manor, NY (US)

(73) Assignee: International Business Machines Corporation, Armonk, NY (US)

( * ) Notice: Subject to any disclaimer, the term of this patent is extended or adjusted under 35 U.S.C. 154(b) by 362 days.

(21) Appl. No.: 17/151,371

(22) Filed: Jan. 18, 2021

(65) Prior Publication Data
US 2021/0181143 A1 Jun. 17, 2021

Related U.S. Application Data

(62) Division of application No. 15/299,762, filed on Oct. 21, 2016, now Pat. No. 10,928,356.

(51) Int. Cl.
*G01N 27/414* (2006.01)
*H01L 29/423* (2006.01)
(Continued)

(52) U.S. Cl.
CPC ........ *G01N 27/414* (2013.01); *H01L 29/1087* (2013.01); *H01L 29/408* (2013.01); *H01L 29/4238* (2013.01); *H01L 29/42356* (2013.01)

(58) Field of Classification Search
CPC ..... G01N 27/414–417; G01N 27/4167; G01N 27/4145; H01L 29/2924; H01L 29/13073;
(Continued)

(56) References Cited

U.S. PATENT DOCUMENTS

2004/0238379 A1* 12/2004 Lindsay ............... C12Q 1/6825
205/792
2010/0044225 A1 2/2010 Kim
(Continued)

OTHER PUBLICATIONS

Double layer (surface science). Downloaded from https://en.wikipedia.org/wiki/Double_layer_(surface_science) on May 19, 2016. pp. 1-8.
(Continued)

*Primary Examiner* — Gurpreet Kaur
(74) *Attorney, Agent, or Firm* — L. Jeffrey Kelly; Otterstedt & Kammer PLLC

(57) ABSTRACT

A substrate's embedded substrate contact electrode forms a reference voltage point. A gate insulator is spaced outwardly from the substrate and has an exposed outer surface configured for contact with a fluid analyte. A device region is intermediate the substrate and the gate insulator; source and drain regions are adjacent the device region; and a field insulator is spaced outwardly of the drain region, the source region, and the substrate away from the device region. The gate insulator and the field oxide are formed of different materials having different chemical sensitivities to the fluid analyte. The field insulator is coupled to the substrate through the field insulator capacitance. The gate insulator capacitance is much smaller than the field insulator capacitance. The embedded substrate contact electrode can be connected to a separate voltage so that the electrical potential between the substrate and the source region can be controlled.

20 Claims, 8 Drawing Sheets

(51) Int. Cl.
　　　*H01L 29/10*　　　(2006.01)
　　　*H01L 29/40*　　　(2006.01)
(58) Field of Classification Search
　　　CPC ............... H01L 29/4238; H01L 29/408; H01L
　　　　　　29/1087; H01L 29/42356; H01L 29/8391;
　　　　　　　　H01L 29/513; H01L 29/6684; H01L
　　　　　　29/6658; H01L 51/0049; H01L 51/0558
　　　See application file for complete search history.

(56) References Cited

U.S. PATENT DOCUMENTS

| | | |
|---|---|---|
| 2011/0169056 A1 | 7/2011 | Wey |
| 2014/0179047 A1 | 6/2014 | Afzali-Ardakani |
| 2014/0370636 A1 | 12/2014 | Dalton |
| 2015/0125872 A1 | 5/2015 | Chen |
| 2015/0276653 A1 | 10/2015 | Hekmatshoartabari |
| 2017/0227533 A1 | 8/2017 | Lin |
| 2018/0113092 A1 | 4/2018 | Solomon |

OTHER PUBLICATIONS

Double-layer capacitance. Downloaded from https://en.wikipedia.org/wiki/Doublelayer_capacitance on May 19, 2016. pp. 1-4.

U. Guth et al., Solid-state reference electrodes for potentiometric sensors. Article in Journal of Solid State Electrochemistry . Dec. 2008. 13:27-39 Reprint pp. 1-14.

M. Waleed Shinwari et al, Microfabricated Reference Electrodes and their Biosensing Applications. Sensors 2010, 10, pp. 1679-1715, Mar. 2, 2010.

Solvent-Processible Polymer Membrane-Based Liquid Junction-Free Reference Electrode. Anal. Chem., 1998, 70 (16), pp. 3377-3383. Abstract.

Adel S. Sedra and Kenneth C. Smith, Microelectronic Circuits, Third Edition, Oxford University Press, New York, frontispiece and pp. 299-301 and 315-316.

Paul J. Otterstedt, List of IBM Patents or Patent Applications Treated as Related, Jan. 18, 2021, pp. 1-2.

\* cited by examiner

ION SENSITIVE FIELD EFFECT TRANSISTOR (FET) WITH BACK-GATE COUPLED REFERENCE ELECTRODE

CROSS-REFERENCE TO RELATED APPLICATIONS

This patent application is a divisional of U.S. patent application Ser. No. 15/299,762 filed Oct. 21, 2016, entitled "ION SENSITIVE FIELD EFFECT TRANSISTOR (FET) WITH BACK-GATE COUPLED REFERENCE ELECTRODE." The complete disclosure of the aforementioned U.S. patent application Ser. No. 15/299,762 is expressly incorporated herein by reference in its entirety for all purposes.

STATEMENT OF GOVERNMENT RIGHTS

Not Applicable.

FIELD OF THE INVENTION

The present invention relates to the electrical and electronic arts, and, more particularly, to silicon device and integration technology, medical testing apparatus, and the like.

BACKGROUND OF THE INVENTION

Ion-sensitive field effect transistors (ISFETs) are becoming an increasingly important component of medical testing and in situ monitoring. An obstacle to achieving ultra-miniaturized sensing capability is the reference electrode, which continues to be bulky and difficult to apply.

SUMMARY OF THE INVENTION

Principles of the invention provide techniques for ion sensitive FETs with back-gate coupled reference electrodes. In one aspect, an exemplary ion-sensitive field effect transistor apparatus includes a substrate, the substrate in turn including an embedded substrate contact electrode forming a reference voltage point. Also included is a gate insulator spaced outwardly from the substrate. The gate insulator has an exposed outer surface configured for contact with a fluid analyte. A device region is intermediate the substrate and the gate insulator; a source region is adjacent the device region; a drain region is adjacent the device region; and a field insulator is spaced outwardly of the drain region, the source region, and the substrate away from the device region. The gate insulator and the field oxide are formed of different materials having different chemical sensitivities to the fluid analyte. The field insulator has a field insulator capacitance and is coupled to the substrate through the field insulator capacitance. The gate insulator has a gate insulator capacitance much smaller (e.g., ten or more times smaller) than the field insulator capacitance. The substrate is configured to be connected, via the embedded substrate contact electrode, to a separate voltage so that an electrical potential between the substrate and the source region can be controlled.

In another aspect, an exemplary method includes providing an ion-sensitive field effect transistor apparatus such as described just above; exposing the gate insulator of the ion-sensitive field effect transistor apparatus to the fluid analyte, thereby forming a liquid gate; operating the ion-sensitive field effect transistor apparatus with the liquid gate under known applied voltage conditions, including a known value of the separate voltage controlling the electrical potential between the substrate and the source region; measuring the drain current of the ion-sensitive field effect transistor apparatus during the operation; and determining the pH of the fluid analyte by comparing the measured drain current to predetermined data.

As used herein, "facilitating" an action includes performing the action, making the action easier, helping to carry the action out, or causing the action to be performed. Thus, by way of example and not limitation, instructions executing on one processor might facilitate an action carried out by instructions executing on a remote processor, by sending appropriate data or commands to cause or aid the action to be performed. For the avoidance of doubt, where an actor facilitates an action by other than performing the action, the action is nevertheless performed by some entity or combination of entities.

Techniques of the present invention can provide substantial beneficial technical effects. For example, one or more embodiments provide an ion-sensitive field effect transistor (ISFET) wherein a separately controlled reference electrode is integrated onto the device chip in a way that is compact, efficient and simple to fabricate.

These and other features and advantages of the present invention will become apparent from the following detailed description of illustrative embodiments thereof, which is to be read in connection with the accompanying drawings.

DETAILED DESCRIPTION OF PREFERRED EMBODIMENTS

As noted, ion-sensitive field effect transistors (ISFETs) are becoming an increasingly important component of medical testing and in situ monitoring. An obstacle to achieving ultra-miniaturized sensing capability is the reference electrode, which continues to be bulky and difficult to apply. One or more embodiments of the invention advantageously integrate a separately controlled reference electrode onto the device chip in a way that is compact, efficient and simple to fabricate.

Figure 1:
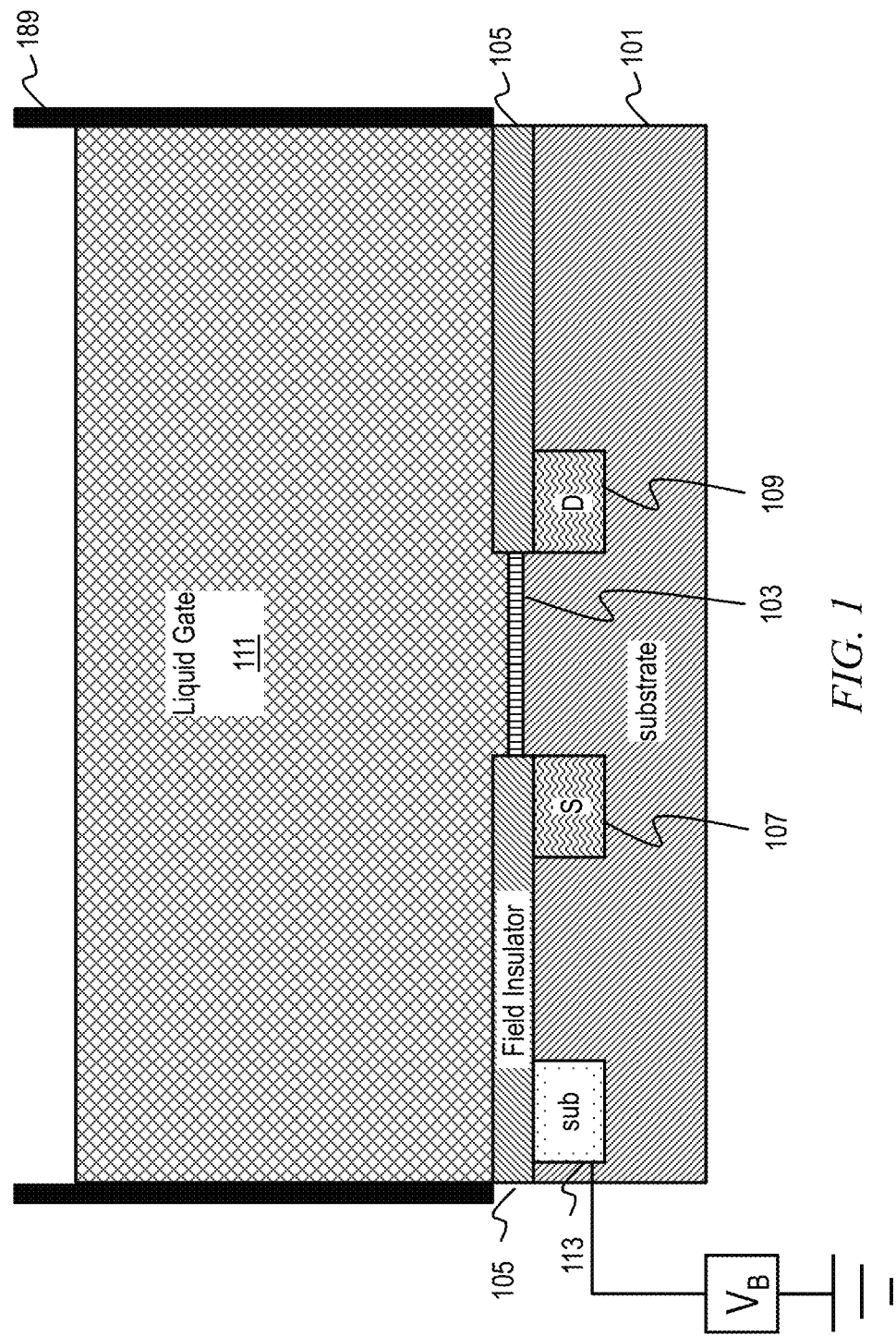
FIG. 1 shows an ion-sensitive FET (ISFET) on a bulk semiconductor substrate, where the device surface is covered by a gate insulator and the surface outside of the device by a field insulator, according to an aspect of the invention.
Figure 2:
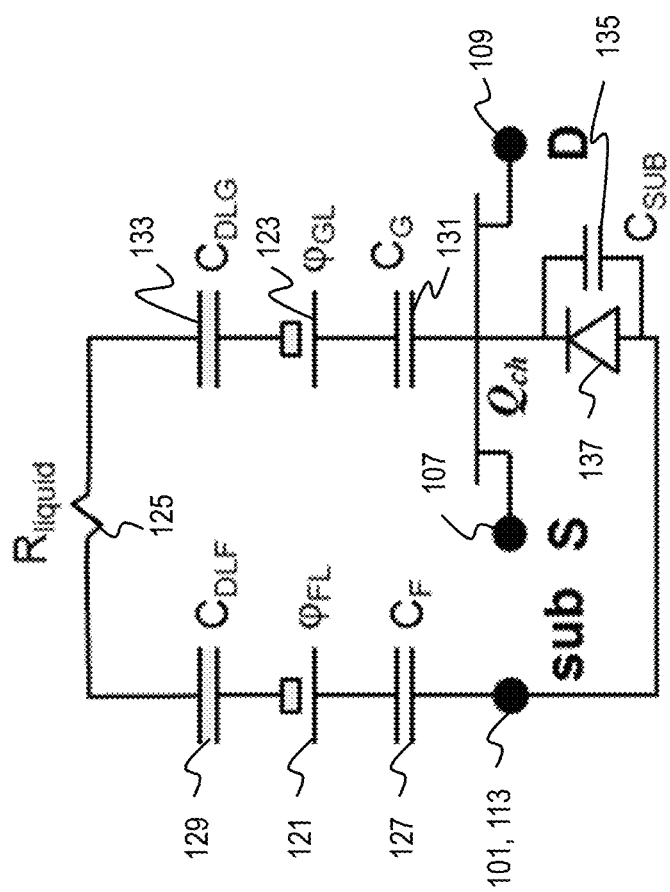
FIG. 2 shows an equivalent circuit for the ISFET of FIG. 1, including the ISFET, liquid, field insulator and substrate, according to an aspect of the invention.

FIG. 1 shows an ion-sensitive FET (ISFET) on a bulk semiconductor substrate 101, where the device surface is covered by a gate insulator 103 and the surface outside of the device by a field insulator 105, according to an aspect of the invention. The ISFET includes source 107, drain 109, substrate electrode 113, and liquid gate 111. FIG. 2 shows an equivalent circuit for the ISFET of FIG. 1, including the ISFET, liquid, field insulator and substrate, according to an aspect of the invention. The conducting liquid of the liquid gate 111, represented in the circuit diagram by its resistance $R_{liquid}$ 125, couples to the substrate 101 through the substrate contact 113, hence the source 107, through the capacitance $C_F$ 127 of the field insulator 105, and its double-layer capacitance $C_{DLF}$ 129, and also couples to the ISFET (i.e., region of the substrate 101 directly under the gate insulator 103) through the capacitance $C_G$ 131 of the gate insulator 103 and its double layer capacitance $C_{DLG}$ 133.

As will be appreciated by the skilled artisan, double-layer capacitance is the storing of electrical energy via the electrical double layer effect (an electrical double layer is a structure that appears on the surface of an object when it is exposed to a fluid).

Charge is transferred across both the field insulator 105 and the gate insulator 103 by the activity of the respective surfaces with the liquid, resulting in electrochemical potentials $\varphi_{FL}$ and $\varphi_{GL}$ which are respectively labeled 121 and 123 in FIG. 2. These potentials are different because of the different sensitivities of the two surfaces to the ions in the liquid.

The coupling between the substrate 101 with its contact 113 and the ISFET is represented by the substrate capacitance $C_{SUB}$ 135 in parallel with diode 137.

Thus, from the definition of capacitance (Q=CV) and the well-known formula for the equivalent capacitance of capacitors in series, the charge $Q_{ch}$ transferred to the ISFET is:

$$Q_{ch} = \qquad (1)$$
$$(V_{SUB} + \varphi_{GL} - \varphi_{FL}) \Big/ \left( \frac{1}{C_G} + \frac{1}{C_{DLG}} + \frac{1}{C_{DLF}} + \frac{1}{C_F} \right) + V_{SUB} C_{SUB} \cong$$
$$C_G(\varphi_{GL} - \varphi_{FL}) + V_{SUB} C_{SUB}.$$

where:
$\varphi_{FL}$=electrochemical potential due to activity of field insulator 105 with liquid 111,
$\varphi_{GL}$=electrochemical potential due to activity of gate insulator 103 with liquid 111,
$V_{SUB}$=voltage on substrate 101 with its contact 113,
$C_G$=capacitance of gate insulator 103,
$C_{DLG}$=double layer capacitance at interface between liquid and gate insulator 103,
$C_{DLF}$=double layer capacitance at interface between liquid and field insulator 105,
$C_F$=capacitance of field insulator 105, and
$C_{SUB}$=capacitance of substrate 101.

Typically, the gate insulator capacitance is much less than the double-layer capacitances and is also much less than the capacitance of the field insulator, since the field area is much larger than the device area. Thus, if the field insulator is de-sensitized, $\varphi_{FL}=\varphi_{GL}$, and the substrate electrode 113, which is under the field insulator 105, acts as a reference electrode. There is also some direct coupling of the reference voltage via $C_{SUB}$ which is undesirable.

Figure 3:
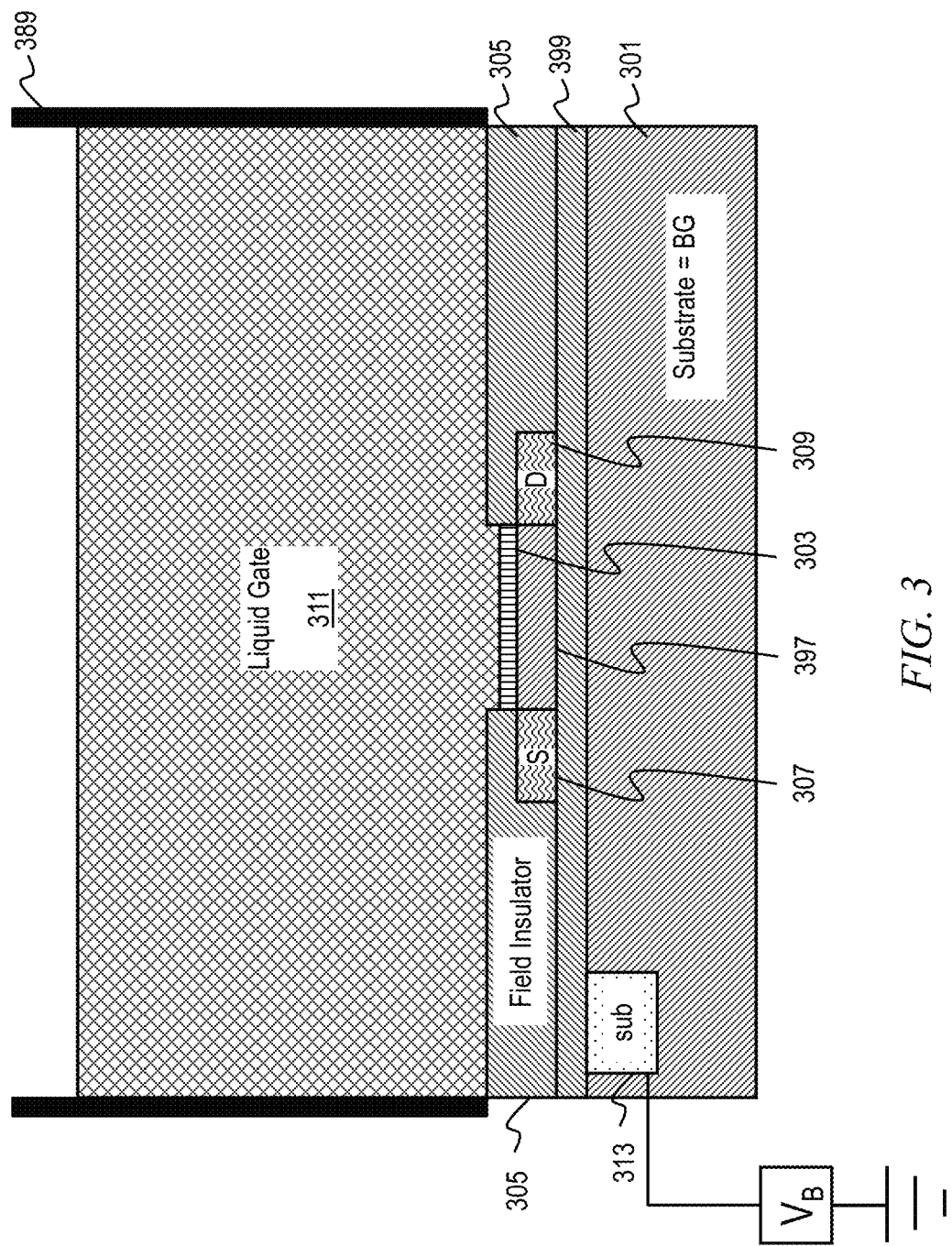
FIG. 3 shows an ISFET on a silicon-on-insulator (SOI) substrate, where the device surface is covered by a gate insulator and the SOI outside of the device is etched away and replaced by a field insulator, allowing the liquid to couple to the substrate via the field insulator, according to an aspect of the invention.
Figure 4:
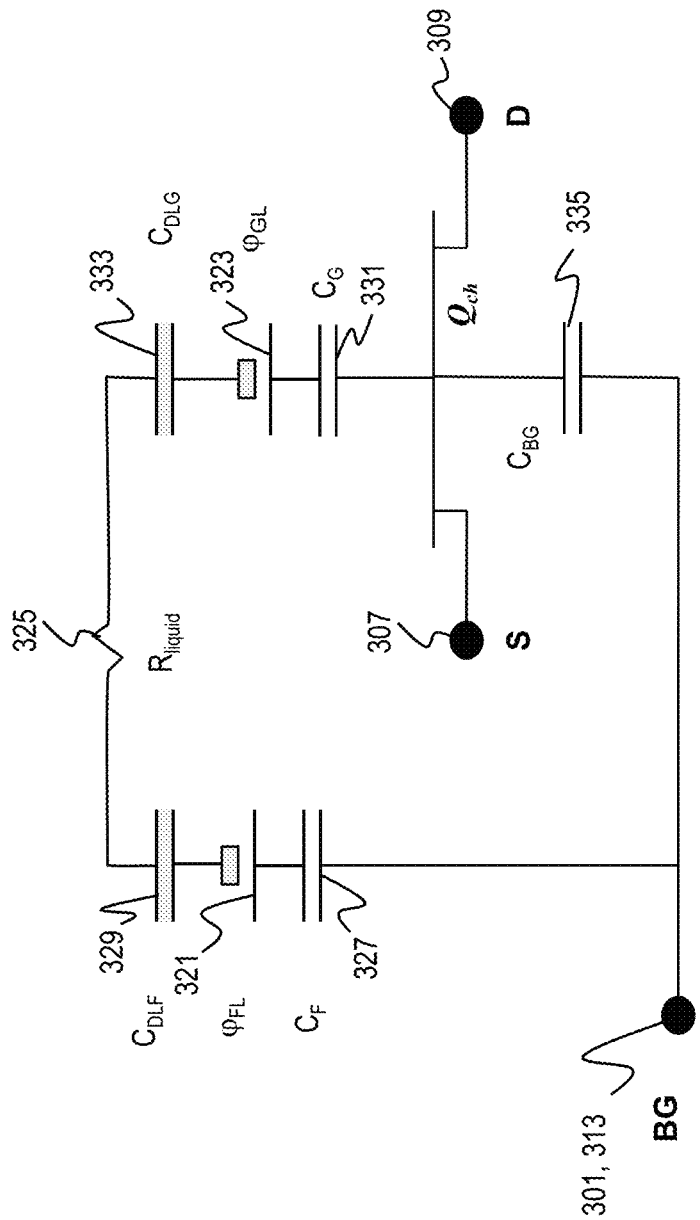
FIG. 4 shows an equivalent circuit for the ISFET of FIG. 3, including the ISFET, liquid, field insulator and substrate acting as a back-gate, according to an aspect of the invention.

FIG. 3 shows an ISFET on a silicon-on-insulator (SOI) substrate (top silicon layer 397, insulator 399, and bottom silicon layer 301 with embedded substrate electrode 313), where the device surface is covered by a gate insulator 303 and the SOI (i.e., top silicon layer 397 thereof) outside of the device is etched away and replaced by a field insulator 305, allowing the liquid 311 to couple to the substrate 301 via the field insulator 305, according to an aspect of the invention. FIG. 4 shows an equivalent circuit for the ISFET of FIG. 3, including the ISFET, liquid, represented in the circuit diagram by its resistance $R_{liquid}$ 325, field insulator and substrate acting as a back-gate. In particular, the embodiment of FIGS. 3 and 4 includes an ISFET on a silicon-on-insulator substrate where the top silicon layer 397 is etched away everywhere except for (i) the device area, and (ii) the area of the integrated connections to the source and drain 307, 309 (given the teachings herein, the skilled artisan can implement contacted source and drain regions using known techniques). The ISFET is completely insulated from the substrate 301 by layer 399, and substrate 301 is now used as a back-gate (node 313). As in the example in FIG. 1, the substrate is coupled through the capacitance of the field oxide via the liquid to the gate insulator of the ISFET. Note that although the back gate can modulate the channel directly through $C_{BG}$, the modulation via the front gate is much stronger since $C_G \gg C_{BG}$. The channel charge $Q_{ch}$ is now given by:

$$Q_{ch} = (V_{BG} + \varphi_{GL} - \varphi_{FL}) \Big/ \left( \frac{1}{C_G} + \frac{1}{C_{DLG}} + \frac{1}{C_{DLF}} + \frac{1}{C_F} \right) + V_{BG} C_{BG} \cong \qquad (2)$$
$$C_G(V_{BG} + \varphi_{GL} - \varphi_{FL}).$$

where:
$\varphi_{FL}$=electrochemical potential due to activity of field insulator 305 with liquid 311, labeled 321,
$\varphi_{GL}$=electrochemical potential due to activity of gate insulator 303 with liquid 311, labeled 323
$V_{BG}$=back gate voltage on substrate 301, at node 313,
$C_G$=capacitance of gate insulator 303, labeled 331
$C_{DLG}$=double layer capacitance at interface between liquid and gate insulator 303, labeled 333,
$C_{DLF}$=double layer capacitance at interface between liquid and field insulator 305, labeled 329,
$C_F$=capacitance of field insulator 305, labeled 327, and
$C_{BG}$=capacitance of back gate substrate 301, labeled 335.

The reduction of $C_{BG}$ 335 in the SOI implementation compared to $C_{SUB}$ 135 in the bulk implementation increases the sub-threshold slope of the ISFET, which increases its voltage sensitivity, and the lower leakage current minimizes drift and unwanted electrochemical reactions.

Figure 5:
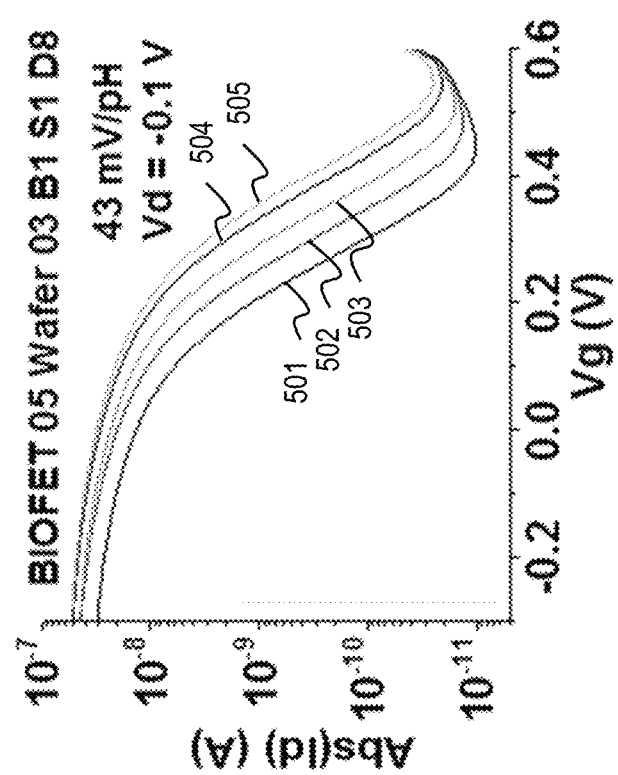
FIGS. 5 and 6 show non-limiting exemplary experimental results on the ISFET of FIG. 3, including the sensitivity of the drain current to back gate voltage and pH (FIG. 5), and the threshold voltage (Vt) dependence on pH for several different FET sensors (FIG. 6), according to an aspect of the invention.
Figure 6:
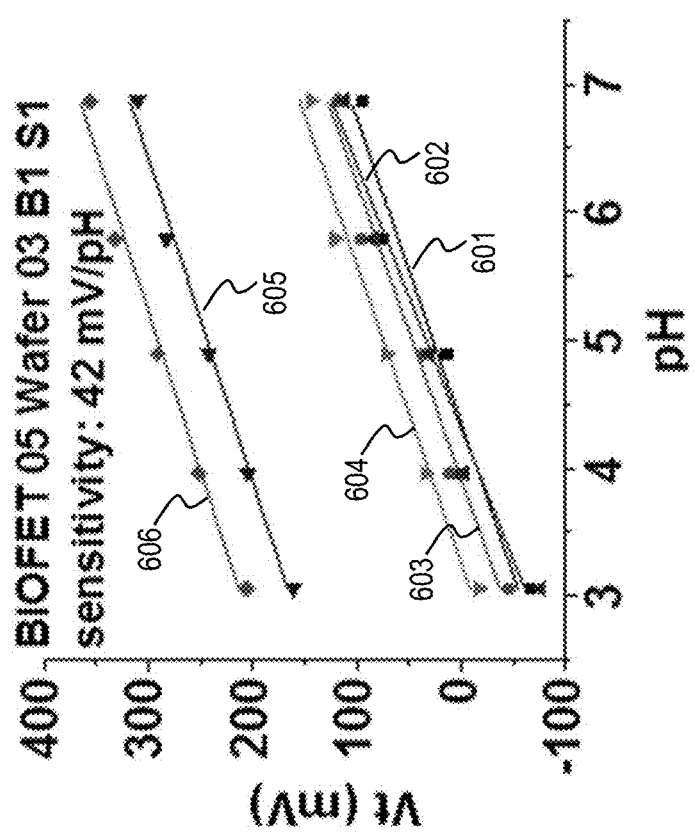

FIGS. 5 and 6 show non-limiting exemplary experimental results on the ISFET of FIG. 3, including the sensitivity of the drain current to back gate voltage and pH of the liquid 311 (FIG. 5), and the threshold voltage (Vt) dependence on pH for several different FET sensors (FIG. 6). Note that the same liquid may be used in all embodiments. Vt is defined as the back gate voltage at which the device current Id=1 nA. The different FET sensors are different devices of the same structure on the same wafer. In FIG. 5, the curves 501, 502, 503, 504, and 505 are for pH values of, respectively, 3, 4, 5, 6, and 7. In FIG. 6 the curves 601, 602, 603, 604, 605, and 606 are for, respectively, a device designated as D4 with square symbols; a device designated as D6 with vertical triangle symbols; a device designated as D5 with round symbols; a device designated as D7 with inverted triangle symbols; a device designated as D9 with left-pointing triangle symbols; and a device designated as D8 with diamond symbols.

The experimental ISFET was fabricated on an SOI substrate with an $HfO_2$ gate insulator 303 and a $SiO_2$ field insulator 305. Efficient control of the ISFET subthreshold current via the back-gate was demonstrated with a sub-threshold swing of 94 mV/decade and showing modulation by pH of 40 mV/pH This is reduced from the ideal Nernst value of 60 mV/pH by the offsetting sensitivity of the field oxide of ~20 mV/pH.

Figure 7:
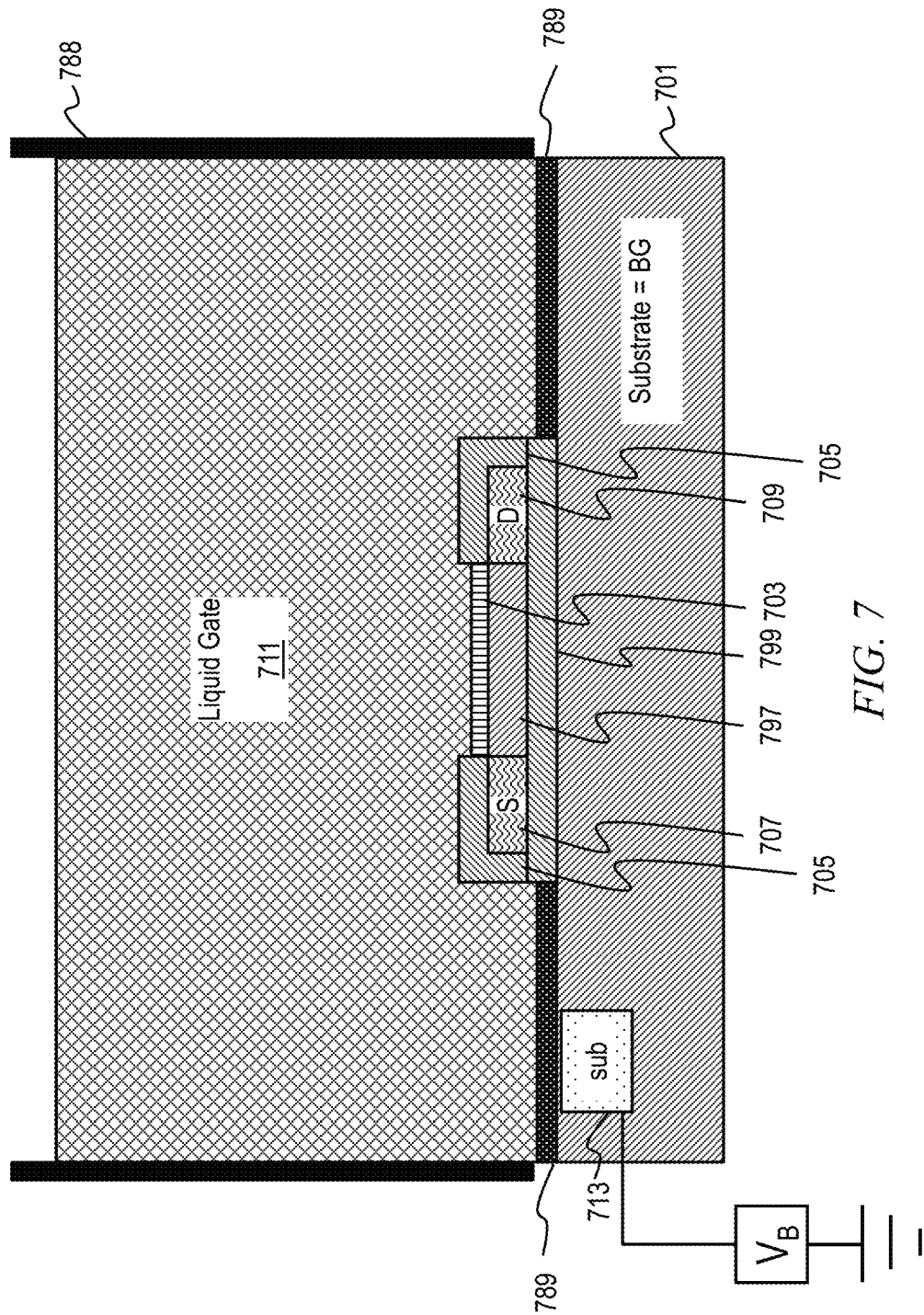
FIG. 7 shows an alternative embodiment of the reference electrode structure wherein the field oxide is replaced by a special layer or layers, according to an aspect of the invention.

FIG. 7 shows an alternative embodiment of the reference electrode structure wherein the field oxide 305 of FIG. 3 is replaced by a special layer or layers 789, according to an aspect of the invention (in some instances, field oxide 705 is present only over the source and drain regions 707, 709; in other cases, field oxide can be present in other areas as well, as long as there is a large enough area of layer or layers 789 for sensing purposes). In FIG. 7, the SOI 797 (i.e., outer silicon layer) and buried oxide 799, outside of the device and interconnect areas, are both etched away and replaced by customized layers 789 to act as a reference electrode. The layer(s) 789 may be electrically conducting or electrically insulating. For example, the customized layers could be Ag+AgCl as in a conventional reference electrode. In FIG. 7, elements 701, 703, 705, 707, 709, 711, 797, and 799 are similar to elements 301, 303, 305, 307, 309, 311, 397, and 399 in FIG. 3, except to the extend described herein.

Figure 8:
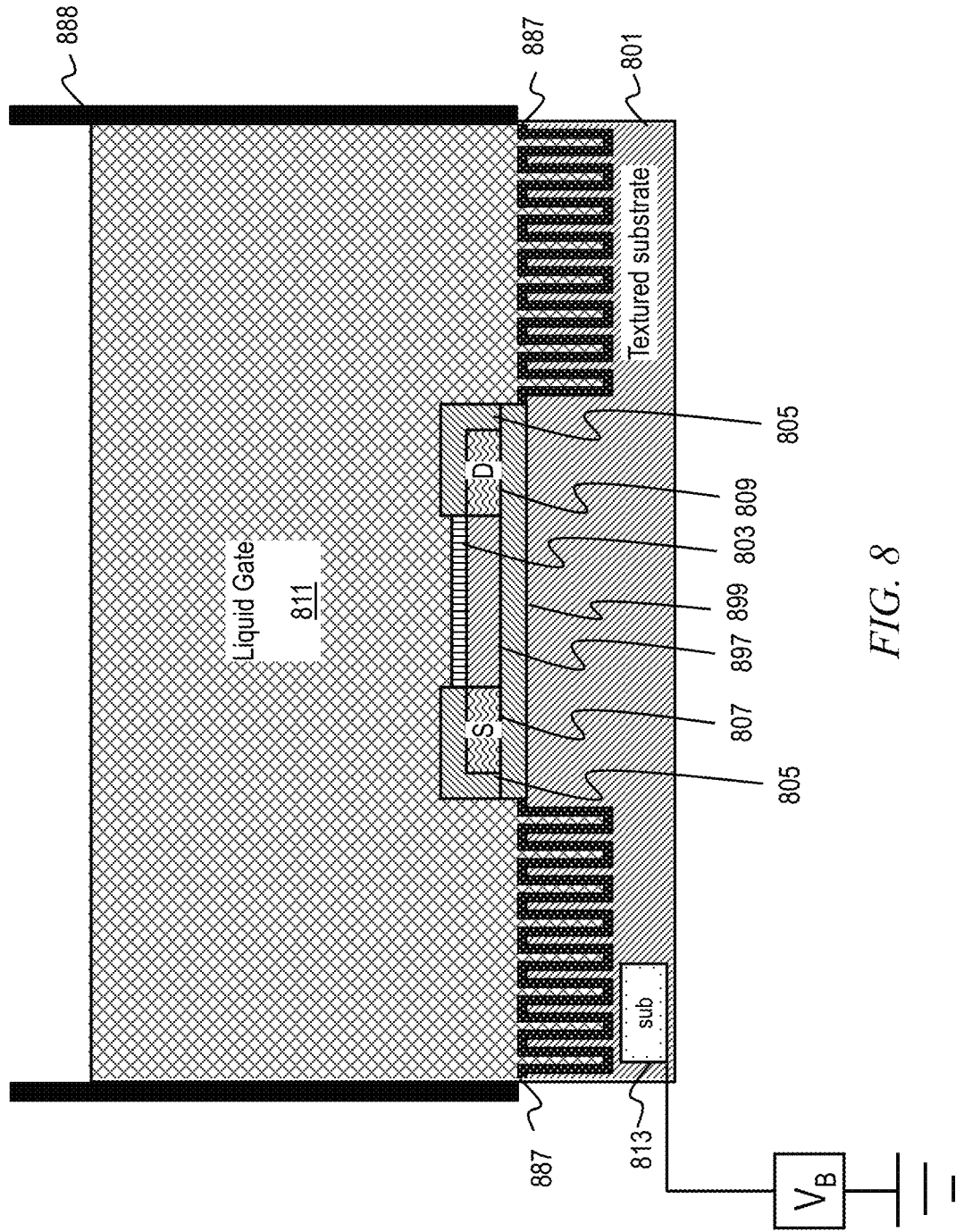
FIG. 8 shows an alternative embodiment of the reference electrode structure wherein the substrate is textured to increase the functionalized area, according to an aspect of the invention.

FIG. 8 shows an alternative embodiment of the reference electrode structure wherein the substrate is textured to increase the functionalized area, according to an aspect of the invention. In FIG. 8, it is shown that the substrate surface (surface of 801) could be textured, greatly increasing the surface area, hence chemical storage, of the reference electrode 887. In FIG. 8, elements 801, 803, 805, 807, 809, 811, 897, and 899 are similar to elements 701, 703, 705, 707, 709, 711, 797, and 799 in FIG. 7, except to the extend described herein.

In one or more embodiments, the capacitance $C_F$ is at least 100 times greater than $C_G$. In one or more embodiments, the top Si layer 397, 797, 897 is removed from everywhere, to expose buried oxide 399, 799, 899 except at the locations of the FET sensors and metal lines connecting source and drain to bond pads.

In some embodiments, the $C_F$ surface is used as the sensing surface. Since this surface is significantly larger than $C_G$ (gate dielectric surface of FET), the response time will be faster—this is so because the larger area can accumulate more analyte in a given time and therefore sensing will be faster.

One or more embodiments thus provide an ISFET on SOI where the top silicon layer 397, 797, 897 is removed everywhere outside of the ISFET. In at least some such embodiments, the substrate is coupled to the liquid through a field insulator 305. In one or more embodiments, the substrate source and drain are separately contacted so that the drain current can be separately measured.

In one or more embodiments, the field insulator and the gate insulator are chemically dissimilar materials having different responses to the chemicals being tested.

In one or more instances, the buried oxide is removed outside of the ISFET and replaced by an insulator, chosen specifically for its chemical response.

In some cases, the substrate surface outside of the ISFET is textured to increase its surface area.

Given the discussion thus far, it will be appreciated that, in general terms, an exemplary ion-sensitive field effect transistor apparatus, according to an aspect of the invention, includes a substrate 101, 301. The substrate in turn includes an embedded substrate contact electrode 113, 313 forming a reference voltage point. Also included is a gate insulator 103, 303 spaced outwardly from the substrate. The gate insulator has an exposed outer surface configured for contact with a fluid analyte. For the avoidance of doubt, one or more embodiments do not include a gate per se but rather only the gate insulator; the gate is formed in use by the fluid analyte 111, 311. Non-limiting examples of analytes include any electrically conducting solution (e.g., chemical or biological solution) where it is desired to detect protons (i.e., measure pH). Non-limiting examples of such solutions include blood and saliva. Furthermore, beyond proton detection, to detect other molecules, a Hafnium Oxide layer (discussed elsewhere herein) can be functionalized using known techniques.

A device region (in FIG. 1, region immediately under insulator 103; in FIG. 3, 397) is located intermediate the substrate and the gate insulator. A source region 107, 307 is adjacent the device region as shown in FIGS. 1 and 3 respectively. A drain region 109, 309 is adjacent the device region as shown in FIGS. 1 and 3 respectively. A field insulator 105, 305 is spaced outwardly of the drain region, the source region, and those portions of the substrate that are away from the device region.

The gate insulator and the field oxide are formed of different materials having different chemical sensitivities to the fluid analyte. For example, the gate insulator could be made of Hafnium Oxide and the field insulator could be made of Silicon Dioxide. The materials to be used depend on the application—for pH measurement, one can use, e.g., Hafnium Oxide or Aluminum Oxide on the gate dielectric; for protein detection, one could use coated Hafnium Oxide. Given the teachings herein, the skilled artisan can select appropriate materials for desired applications.

The field insulator has a field insulator capacitance and is coupled to the substrate through the field insulator capacitance. The gate insulator has a gate insulator capacitance much smaller (e.g., at least ten times smaller) than the field insulator capacitance. The substrate is configured to be connected, via the embedded substrate contact electrode, to a separate voltage so that an electrical potential between the substrate and the source region can be controlled. Regarding what is meant by a "separate voltage," the skilled artisan will appreciate that a field effect transistor generally has four contacts; the gate, the drain, the source, and the substrate or body terminal. In one or more embodiments, the source and drain contacts are conventional, while the gate has a coupling from the electrolyte 111, 311 back through the field oxide 105, 305. The substrate 101, 301 can be separately biased to in turn bias the FET to a particular operating point to obtain a particular sensitivity of the measurement. The effect of separately biasing the substrate is, in and of itself, well known from texts such as Adel S. Sedra and Kenneth C. Smith, Microelectronic Circuits Third Edition (Oxford University Press, New York, 1991) (Chapter 5 pages 298-403 especially pages 299-301 and 315-316 thereof, the latter discussing how a change in the reverse-bias voltage between the source and substrate or body will in turn change the device threshold voltage). All pages of the Sedra and Smith reference are expressly incorporated herein by reference in their entirety for all purposes. Given the teachings herein, the skilled artisan will be able to select substrate bias voltages to obtain desired measurement sensitivity for a given application.

In the particular embodiment shown in FIG. 3, the substrate is a silicon-on-insulator (SOI) substrate, in turn including a top silicon layer 397, a buried oxide insulator layer 399, and a bottom silicon layer 301. The field insulator 305 resides on the buried oxide layer; the device region is formed in the top silicon layer; and the bottom silicon layer is configured to function as a back gate. The use of the SOI substrate including a substrate contact 313 permits the substrate voltage to be controlled over a bigger range (positive and negative for SOI vs. one polarity only for bulk). This permits sensing for a wider range of chemical conditions.

Some embodiments further include a voltage source VB coupled to the embedded substrate contact electrode and providing the separate voltage.

Some embodiments further include a receptacle 189, 389 to receive the fluid analyte; the fluid analyte in the receptacle forms a liquid gate in fluid contact with the gate insulator. The top surface of the gate insulator 103, 303 is exposed to the liquid analyte in use and so should not be excessively corroded or altered by the analyte. The parts of the device not shown in the figure including the leads and contact pads should be shielded from the analyte as is standard practice, in a manner in itself well known to the skilled artisan.

In the particular embodiment shown in FIG. 1, the substrate 101 is a bulk semiconductor and the field insulator 105 resides directly on the substrate.

Furthermore, given the discussion thus far, it will be appreciated that, in general terms, another exemplary ion-sensitive field effect transistor apparatus, according to another aspect of the invention, includes a silicon on insulator substrate, in turn including a top silicon layer 797, 897, a buried oxide insulator layer 799, 899, and a bottom silicon layer 701, 801. Also included is a gate insulator 703, 803 spaced outwardly from the substrate. The gate insulator has an exposed outer surface configured for contact with a fluid analyte 711, 811. For the avoidance of doubt, as noted above, one or more embodiments do not include a gate per se but rather only the gate insulator; the gate is formed in use by the fluid analyte 711, 811. Non-limiting examples of analytes are set forth above.

A device region is formed in the top silicon layer 797, 897 intermediate the buried oxide insulator layer and the gate insulator; a source region 707, 807 is adjacent the device region as seen in FIGS. 7 and 8, respectively, and a drain region 709, 809 is adjacent the device region, as also seen in FIGS. 7 and 8, respectively.

A functionalized layer 789, 887 is spaced outwardly of the bottom silicon layer away from the source, the drain, and the device region, as also seen in FIGS. 7 and 8, respectively. The bottom silicon layer includes a contact for the back back-gate reference voltage 713, 813.

In one or more embodiments, the functionalized layer generates a potential which is added to the reference potential.

The functionalized layer can be conducting (e.g., Titanium Nitride) or insulating (e.g., oxides such as Hafnium Oxide or Silicon Dioxide).

In some instances, the functionalized layer includes a silver-silver chloride layer.

It should be pointed out that the silicon substrate typically provides physical support and an electrical contact but plays no chemical role.

In some instances, such as shown in FIG. 8, the functionalized layer is textured to increase its surface area. In the exemplary embodiment of FIG. 8, the substrate and functionalized layer are both textured. For example, form trenches on the substrate using known techniques and deposit material for the functionalized layer conformally to coat the trenches.

Some embodiments further include a receptacle 788, 888 to receive the fluid analyte; the fluid analyte in the receptacle forms a liquid gate in fluid contact with the gate insulator.

In another aspect, an exemplary method includes providing an ion-sensitive field effect transistor apparatus, such as, for example, is shown and described with respect to FIG. 3. A further step includes exposing the gate insulator of the ion-sensitive field effect transistor apparatus to the fluid analyte, thereby forming a liquid gate 311. A still further step includes operating the ion-sensitive field effect transistor apparatus with the liquid gate under known applied voltage conditions, including a known value of the separate voltage VB controlling the electrical potential between the substrate and the source region. Even further steps include measuring the drain current of the ion-sensitive field effect transistor apparatus during the operation; and determining the pH of the fluid analyte by comparing the measured drain current to predetermined data. For example, develop a family of curves such as are shown in FIG. 5 under known conditions with reference fluids of known pH, then measure the drain current for an unknown fluid under similar operating conditions and plot it on FIG. 5 for the corresponding $V_g$ value. The pH will be given by finding the closest curve or interpolation if a more precise answer is desired.

Given the teachings herein, the skilled artisan will be able to fabricate one or more embodiments of the invention using known techniques. In this regard, typical FEOL (front-end-of-line) processes include, for example, wafer preparation, electrical isolation, well formation, gate patterning, spacer formation, extension and source/drain implantation, silicide formation, and dual stress liner formation. Although the exemplary method and the structures formed thereby are entirely novel, many of the individual processing steps required to implement the method may utilize conventional semiconductor fabrication techniques and conventional semiconductor fabrication tooling. These techniques and tooling will already be familiar to one having ordinary skill in the relevant arts given the teachings herein. Moreover, details of the individual processing steps used to fabricate semiconductor devices described herein may be found in a number of publications, for example, James D. Plummer et al., Silicon VLSI Technology: Fundamentals, Practice, and Modeling 1st Edition, Prentice Hall, 2001; S. Wolf and R. N. Tauber, Silicon Processing for the VLSI Era, Volume 1, Lattice Press, 1986; S. Wolf, Silicon Processing for the VLSI Era, Vol. 4: Deep-Submicron Process Technology, Lattice Press, 2003; and S. M. Sze, VLSI Technology, Second Edition, McGraw-Hill, 1988, all of which are incorporated by reference herein. It is also emphasized that the descriptions provided herein are not intended to encompass all of the processing steps that may be required to successfully form a functional device. Rather, certain processing steps that are conventionally used in forming integrated circuit devices, such as, for example, wet cleaning steps, are purposefully not described herein for economy of description. However, one skilled in the art will readily recognize those processing steps omitted from this more generalized description.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. An ion-sensitive field effect transistor apparatus, comprising:
    a silicon on insulator substrate, in turn comprising a top silicon layer, a buried oxide insulator layer, and a bottom silicon layer a gate insulator spaced outwardly from said substrate, said gate insulator having an exposed outer surface configured for contact with a fluid analyte;
    a device region formed in said top silicon layer intermediate said buried oxide insulator layer and said gate insulator;
    a source region adjacent said device region;
    a drain region adjacent said device region; and
    a functionalized layer spaced outwardly of said bottom silicon layer away from said source, said drain, and said device region;
    wherein said bottom silicon layer comprises a back gate reference voltage point.

2. The ion-sensitive field effect transistor apparatus of claim 1, wherein said functionalized layer is conducting.

3. The ion-sensitive field effect transistor apparatus of claim 2, wherein said functionalized layer comprises Titanium Nitride.

4. The ion-sensitive field effect transistor apparatus of claim 1, wherein said functionalized layer is insulating.

5. The ion-sensitive field effect transistor apparatus of claim 4, wherein said functionalized layer comprises Hafnium Oxide.

6. The ion-sensitive field effect transistor apparatus of claim 4, wherein said functionalized layer comprises Silicon Dioxide.

7. The ion-sensitive field effect transistor apparatus of claim 1, wherein said functionalized layer comprises a silver-silver chloride layer.

8. The ion-sensitive field effect transistor apparatus of claim 1, wherein said functionalized layer is textured to increase its surface area.

9. The ion-sensitive field effect transistor apparatus of claim 8, wherein said substrate is textured.

10. The ion-sensitive field effect transistor apparatus of claim 9, wherein trenches are defined in said substrate and said functionalized layer comprises a conformal coating over said trenches.

11. The ion-sensitive field effect transistor apparatus of claim 1, further comprising a receptacle positioned to receive the fluid analyte so that the fluid analyte forms a liquid gate in fluid contact with the gate insulator.

12. The ion-sensitive field effect transistor apparatus of claim 1, further comprising a given fluid analyte.

13. The ion-sensitive field effect transistor apparatus of claim 12, wherein the given fluid analyte comprises an electrically conductive chemical solution.

14. The ion-sensitive field effect transistor apparatus of claim 12, wherein the given fluid analyte comprises an electrically conductive biological solution.

15. The ion-sensitive field effect transistor apparatus of claim 1, further comprising a voltage source coupled to said back gate reference voltage point and applying a reference potential thereto.

16. The ion-sensitive field effect transistor apparatus of claim 15, wherein the functionalized layer generates a potential which is added to the reference potential.

17. A method comprising:
    providing an ion-sensitive field effect transistor apparatus, said apparatus in turn comprising:
        a silicon on insulator substrate, in turn comprising a top silicon layer, a buried oxide insulator layer, and a bottom silicon layer
        a gate insulator spaced outwardly from said substrate, said gate insulator having an exposed outer surface configured for contact with a fluid analyte;
        a device region formed in said top silicon layer intermediate said buried oxide insulator layer and said gate insulator;
        a source region adjacent said device region;
        a drain region adjacent said device region; and
        a functionalized layer spaced outwardly of said bottom silicon layer away from said source, said drain, and said device region;
        wherein said bottom silicon layer comprises a back gate reference voltage point;
    exposing said gate insulator of said ion-sensitive field effect transistor apparatus to said fluid analyte, thereby forming a liquid gate;
    operating said ion-sensitive field effect transistor apparatus with said liquid gate under known applied voltage conditions, including a known value of said back gate reference voltage;
    measuring a drain current of said ion-sensitive field effect transistor apparatus during said operation; and
    determining a pH of said fluid analyte by comparing said measured drain current to predetermined data.

18. The method of claim 17, wherein, in the exposing step, the fluid analyte comprises an electrically conductive chemical solution.

19. The method of claim 17, wherein, in the exposing step, the fluid analyte comprises an electrically conductive biological solution.

20. The method of claim 17, further comprising, with the functionalized layer, generating a potential which is added to the back gate reference voltage.

* * * * *